(12) United States Patent
Yamagata

(10) Patent No.: US 9,382,640 B2
(45) Date of Patent: Jul. 5, 2016

(54) SINGLE CRYSTAL SILICON PULLING SILICA CONTAINER AND MANUFACTURING METHOD THEREOF

(71) Applicant: SHIN-ETSU QUARTZ PRODUCTS CO., LTD., Tokyo (JP)

(72) Inventor: Shigeru Yamagata, Narashino (JP)

(73) Assignee: SHIN-ETSU QUARTZ PRODUCTS CO., LTD., Tokyo (JP)

( * ) Notice: Subject to any disclaimer, the term of this patent is extended or adjusted under 35 U.S.C. 154(b) by 374 days.

(21) Appl. No.: 14/004,085

(22) PCT Filed: Oct. 2, 2012

(86) PCT No.: PCT/JP2012/006291
§ 371 (c)(1),
(2) Date: Sep. 9, 2013

(87) PCT Pub. No.: WO2013/088617
PCT Pub. Date: Jun. 20, 2013

(65) Prior Publication Data
US 2014/0053772 A1  Feb. 27, 2014

(30) Foreign Application Priority Data

Dec. 12, 2011 (JP) ................. 2011-271565

(51) Int. Cl.
*C30B 15/10* (2006.01)
*C03C 3/06* (2006.01)
(Continued)

(52) U.S. Cl.
CPC ............... *C30B 15/10* (2013.01); *C03B 19/095* (2013.01); *C03C 3/06* (2013.01); *C03C 17/004* (2013.01);
(Continued)

(58) Field of Classification Search
CPC ................. C30B 15/10; C30B 15/02
See application file for complete search history.

(56) References Cited

U.S. PATENT DOCUMENTS 4,935,046 A  6/1990 Uchikawa et al.
5,885,071 A  3/1999 Watanabe et al.
(Continued)

FOREIGN PATENT DOCUMENTS

EP  0 319 031 A2  6/1989
EP  2251460 A1  11/2010
(Continued)

OTHER PUBLICATIONS

Dodd et al., "Optical Determinations of OH in Fused Silica," *Journal of Applied Physics*, 1966, pp. 3911, vol. 37.
(Continued)

*Primary Examiner* — Robert M Kunemund
(74) *Attorney, Agent, or Firm* — Oliff PLC

(57) ABSTRACT

The present invention provides a single-crystal silicon pulling silica container including an outer layer made of opaque silica glass containing gaseous bubbles and an inner layer made of transparent silica glass that does not substantially contain the gaseous bubbles; the container also including: a bottom portion, a curved portion, and a straight body portion, wherein continuous grooves are formed on a surface of the inner layer from at least part of the bottom portion to at least part of the straight body portion through the curved portion. As a result, there are provided the single-crystal silicon pulling silica container that can reduce defects called voids or pinholes in the pulled single-crystal silicon and a method for manufacturing such a silica container.

20 Claims, 10 Drawing Sheets

(51) Int. Cl.
   *C03B 19/09*   (2006.01)
   *C03C 17/00*   (2006.01)
   *C03C 17/02*   (2006.01)
   *C30B 15/02*   (2006.01)
   *C30B 29/06*   (2006.01)

(52) U.S. Cl.
   CPC ............ *C03C 17/02* (2013.01); *C03C 2201/30* (2013.01); *C03C 2203/10* (2013.01); *C30B 15/02* (2013.01); *C30B 29/06* (2013.01); *Y02P 40/57* (2015.11); *Y10T 117/1032* (2015.01)

(56) References Cited

U.S. PATENT DOCUMENTS

| | | | |
|---|---|---|---|
| 6,660,671 | B2 | 12/2003 | Werdecker et al. |
| 2009/0151624 | A1* | 6/2009 | Shimazu ............... C30B 15/10 117/208 |
| 2010/0132608 | A1 | 6/2010 | Morikawa et al. |
| 2011/0011334 | A1* | 1/2011 | Shimazu ............... C03B 19/095 117/208 |
| 2011/0048315 | A1 | 3/2011 | Kemmochi et al. |
| 2011/0240663 | A1 | 10/2011 | Yamagata et al. |

FOREIGN PATENT DOCUMENTS

| | | |
|---|---|---|
| JP | S6476993 A | 3/1989 |
| JP | A-01-148782 | 6/1989 |
| JP | B2-4-022861 | 4/1992 |
| JP | H06-279167 A | 10/1994 |
| JP | B2-7-029871 | 4/1995 |
| JP | A-07-206451 | 8/1995 |
| JP | A-07-277743 | 10/1995 |
| JP | A-07-277744 | 10/1995 |
| JP | H0840796 A | 2/1996 |
| JP | B2-2630649 | 7/1997 |
| JP | A-09-255476 | 9/1997 |
| JP | A-10-025184 | 1/1998 |
| JP | H10297992 A | 11/1998 |
| JP | B2-2973057 | 11/1999 |
| JP | A-2002-362932 | 12/2002 |
| JP | A-2004-131380 | 4/2004 |
| JP | 2005272178 A | 10/2005 |
| JP | 2005298288 A | 10/2005 |
| JP | A-2008-201619 | 9/2008 |
| JP | A-2010-126423 | 6/2010 |
| JP | 2010168240 A | 8/2010 |
| JP | 2012017239 A | 1/2012 |
| TW | 201113229 A1 | 4/2011 |
| WO | WO 2009/107834 A1 | 9/2009 |

OTHER PUBLICATIONS

International Search Report issued in International Application No. PCT/JP2012/006291 dated Dec. 18, 2012.
Nov. 12, 2014 Office Action issued in Taiwanese Application No. 101140103.
Dec. 5, 2014 Extended European Search Report issued in European Application No. 12857311.0.
Jun. 18, 2015 Search Report issued in Chinese Patent Application No. 2012800182206.

* cited by examiner (a)

(b)

(c)

(d)

(e)

(f)

SINGLE CRYSTAL SILICON PULLING SILICA CONTAINER AND MANUFACTURING METHOD THEREOF

TECHNICAL FIELD

The present invention relates to a single-crystal silicon pulling silica container and a manufacturing method thereof.

BACKGROUND ART

Silica glass is used for a lens, a prism, and a photomask in a projection aligner (a lithography apparatus) for manufacturing large-scale integration (LSI), a display TFT substrate, a lamp tube, a window material, a reflector, a semiconductor industrial cleaning container, a silicon semiconductor melt container, and others. However, as a raw material of the silica glass, a compound such as expensive silicon tetrachloride must be used, and a silica glass melting temperature or processing temperature is as considerably high as approximately 2000° C., energy consumption is hence high, and a cost rises. Therefore, a silica glass manufacturing method using a relatively inexpensive powder raw material has been conventionally considered.

For example, Patent Literature 1 discloses a method for hydrolyzing silicon alkoxide to provide silica sol, gelling the silica sol to provide wet gel, drying this gel to provide dry gel, and finally performing high-temperature sintering to obtain a transparent silica glass body (a sol-gel method). Furthermore, Patent Literature 2 discloses a method for obtaining transparent silica glass from a silica sol mixed solution made of tetramethoxysilane or tetraethoxysilane and a silica sol solution containing silica fine particles by the sol-gel method. Moreover, Patent Literature 3 discloses that, in a method for manufacturing transparent silica glass by using silicon alkoxide and silica glass fine particles as main raw materials, a heating treatment at a temperature of 200° C. to less than 130° C. is carried out in an oxygen gas containing atmosphere, a heating treatment for raising the temperature to 1700° C. or more is performed in a hydrogen gas containing atmosphere, and a reduced-pressure atmosphere heating treatment is effected between the two heating treatments. However, these conventional sol-gel methods have a problem in a dimensional accuracy of fabricated silica glass at an early stage or heat resisting properties during subsequent use at a high temperature, and their costs are not very low.

Additionally, Patent Literature 4 discloses a method for obtaining a silica containing complex by mixing at least two types of silica glass particles having different characteristics, e.g., a silica glass fine powder and silica glass particles to provide a water containing suspension, then performing compression molding, and effecting sintering at a high temperature (a slip-cast method). Further, Patent Literature 5 discloses a method for fabricating an opaque silica glass composite based on fabrication of a liquid mixture (slurry) containing silica glass particles having a size of 100 μm or less and silica glass granules having a size of 100 μm or more, injection into a molding die, subsequent drying, and sintering. However, according to these conventional slip-cast methods, a compact greatly contracts during a drying process or a sintering process, and a silica glass compact having a high dimensional accuracy and a large thickness cannot be created.

Even now, as a method for manufacturing a silica crucible for LSI single crystal silicon manufacture, such manufacturing methods as described in Patent Literatures 6 and Patent Literature 7 are used. Each of these methods is a method for putting a quartz powder or a synthetic cristobalite powder subjected to an ultra-high purity treatment into a rotating mold, performing molding, then pushing electrodes from above, applying electric power to the electrodes to cause arc discharge, and increasing an atmospheric temperature to a melting temperature zone (which is assumed to be approximately 1800 to 2100° C.) of the quartz powder, thereby melting and sintering the quartz raw material powder.

However, these manufacturing methods have a problem of high costs since the quartz raw material powder having super-high purity is used. Further, when the manufactured silica crucible is used, there occurs such a problem in manufacturing cost and silicon crystal quality that the molten silicon reacts with the silica crucible to produce SiO gas, and this gas is taken into silicon crystal as gaseous bubbles. Moreover, there also arises a problem in heat deformation properties of the silica crucible that a sidewall of the crucible is softened and deformed at the time of pulling the single-crystal silicon.

Additionally, Patent Literature 8 discloses a silica crucible having a three-layer configuration including an outer layer made of natural quartz glass, an intermediate layer made of synthetic quartz glass having high aluminum concentration, and an inner layer made of a high-purity synthetic quartz glass based on an arc discharge melting method of silica powder raw materials (an atmosphere at the time of melting is assumed to be air). Further, an impurity movement preventing effect using the intermediate layer is disclosed. However, in the three-layer configuration based on such a configuration, not only costs are high, but also a problem of gaseous bubbles in manufactured silicon crystal has not been solved.

Furthermore, Patent Literature 9 discloses technology that reduces gaseous bubbles in a molten quartz crucible wall by performing pressure reduction and suction from the periphery of a molding die at the time of arc discharge melting of a silica powder raw material compact. However, a dissolved gas in a silica crucible wall cannot be completely removed by just performing pressure reduction and suction of air that is present in a temporary compact of the silica powder. Moreover, when a silica crucible is used, there occurs a problem that molten silicon reacts with the silica crucible to produce SiO gas and this gas is taken into silicon crystal as gaseous bubbles.

Additionally, Patent Literature 10 discloses a quartz glass crucible that can avoid cavity defects that are produced when bubbles of SiO gas are taken into silicon single crystal. As its means, irregularities provided by forming many scratches on at least part of inner surfaces of a straight body portion and a curved portion of the crucible at a depth of 50 μm to 450 μm. However, when the surfaces having such irregularities are provided, degasification of the generated SiO gas to the outside of the silica container is insufficient, and it is difficult to sufficiently reduce voids or non-pierced small-diameter holes (pinholes) in a silicon wafer producing by slicing and polishing this silicon single crystal.

CITATION LIST

Patent Literatures

Patent Literature 1: Japanese Unexamined Patent Application Publication No. H7-206451
Patent Literature 2: Japanese Unexamined Patent Application Publication No. H7-277743
Patent Literature 3: Japanese Unexamined Patent Application Publication No. H7-277744
Patent Literature 4: Japanese Unexamined Patent Application Publication No. 2002-362932

Patent Literature 5: Japanese Unexamined Patent Application Publication No. 2004-131380
Patent Literature 6: Japanese Examined Patent Application Publication No. H4-22861
Patent Literature 7: Japanese Examined Patent Application Publication No. H7-29871
Patent Literature 8: Japanese Unexamined Patent Application Publication No. H9-255476
Patent Literature 9: Japanese Unexamined Patent Application Publication No. H10-25184
Patent Literature 10: Japanese Unexamined Patent Application Publication No. 2010-126423

DISCLOSURE OF INVENTION

Problem to be Solved by the Invention

In view of the above-described problem, it is an object of the present invention to provide a single-crystal silicon pulling silica container that can reduce defects called voids or pinholes in pulled single crystal silicon and a manufacturing method of such a silica container.

Means for Solving Problem

To solve the above-described problem, according to the present invention, there is provided a single-crystal silicon pulling silica container including an outer layer made of opaque silica glass containing gaseous bubbles and an inner layer made of transparent silica glass that does not substantially contain the gaseous bubbles; the container also including: a bottom portion, a curved portion, and a straight body portion, wherein continuous grooves are formed on a surface of the inner layer from at least part of the bottom portion to at least part of the straight body portion through the curved portion.

According to such a silica container, an argon (Ar) gas contained in a silicon melt or a silicon monoxide (SiO) gas generated when molten silicon reacts with a silica container surface during manufacture of the single-crystal silicon, moves up along the continuous groove on the inner surface of the silica container with growth of a gaseous bubble diameter, and it is released to the outside of the melt from the periphery of the straight body portion of the silica container. As a result, the gaseous bubbles are hard to be taken into the crystal that is being pulled, and the single-crystal silicon having less voids or pinholes can be manufactured.

In the single-crystal silicon pulling silica container according to the present invention, the grooves can be formed to reach a center of the bottom portion.

As described above, since the grooves are formed to the center of the silica container bottom portion, the gaseous bubbles generated at the silica container bottom portion can be also released to the outside of the silicon melt along the continuous grooves.

In the single-crystal silicon pulling silica container according to the present invention, the grooves are not formed in a central part of the bottom portion.

As described above, since the grooves are not formed at the central part of the silica container bottom portion and the grooves are not present immediately below the single-crystal silicon to be pulled, an amount of the gaseous bubbles taken into the single-crystal silicon can be reduced in some cases.

Furthermore, in the single-crystal silicon puling silica container according to the present invention, it is preferable that the grooves are formed in a netlike pattern or a radial pattern on the bottom portion and the curved portion, the radial pattern being centered on a center of the bottom portion.

When the grooves are formed in such a pattern, the gaseous bubbles can be more efficiently released to the outside of the silicon melt.

Moreover, it is preferable that the grooves are formed to reach an upper edge of the straight body portion.

When the grooves are formed to reach the upper edge of the straight body portion of the silica container, the gaseous bubbles can be more assuredly released to the outside of the silicon melt irrespective of the depth of the silicon melt in the container.

Additionally, it is preferable for a cross-sectional shape of each of the grooves to be any one of a V-like shape, a U-like shape, and a rectangular shape.

When each groove having such a cross-sectional shape is provided, the gaseous bubbles can be more efficiently released to the outside of the silicon melt along the groove.

Further, it is preferable for the grooves to be formed at intervals that fall within the range of 1 to 30 mm at least in the straight body portion.

When the grooves are formed in the straight body portion of the silica container at such intervals, the gaseous bubbles can be more efficiently released to the outside of the silicon melt.

Furthermore, it is preferable for the outer layer to have OH group concentration of 10 to 300 ppm by mass and Al concentration of 10 to 300 ppm by mass.

Moreover, it is preferable for the inner layer to have OH group concentration of 1 to 100 ppm by mass and Al concentration of 50 ppm by mass or less.

When the OH group and Al are contained in the outer layer or the inner layer at such concentration, even if a raw material powder that can be a raw material of the silica container is inexpensive and has low purity, the contamination of impurities into the silicon melt can be reduced.

Additionally, according to the present invention, there is provided a method for manufacturing a single-crystal silicon pulling silica container, including: performing heating and melting of a silica powder to fabricate a silica container which comprises an outer layer made of an opaque silica glass containing gaseous bubbles and an inner layer made of transparent silica glass which does not substantially contain gaseous bubbles, the silica container also comprising a bottom portion, a curved portion, and a straight body portion; and then forming continuous grooves on a surface of the inner layer from at least part of the bottom portion to at least part of the straight body portion through the curved portion.

When the continuous grooves are formed on the surface of the inner layer of the silica container by such a method, the silica container having the continuous grooves can be manufactured at a low cost. Since such a silica container is provided, an argon (Ar) gas contained in the silicon melt or a silicon monoxide (SiO) gas generated when the molten silicon reacts with the silica container surface during manufacture of single-crystal silicon, moves up along the continuous grooves on the inner surface with growth of a gaseous bubble diameter, and it is released to the outside of the melt. As a result, the single-crystal silicon having less voids or pinholes can be manufactured.

In this case, the fabrication of the silica container that is effected by heating and melting the silica power can be carried out based on: a step of fabricating a silica powder having a particle size of 10 to 1000 μm as a first raw material powder; a step of putting the first raw material powder into a mold having rotational symmetry, and temporarily molding it into a predetermined shape associated with an inner wall of the mold while rotating the mold, thereby obtaining a temporary compact; and a discharge heating melting step of placing carbon electrodes in the temporary compact, and heating and melting the temporary compact by the discharge heating melting method so that at least an outer side portion of the temporary compact is made of the opaque silica glass and an inner side portion of the same is made of the transparent silica glass.

Further, in this case, there is provided a method for manufacturing a single-crystal silicon pulling silica container including: a step of fabricating a silica powder having a particle size of 10 to 1000 μm and higher purity than the first raw material powder as a second raw material powder; and a step of heating and melting the second raw material powder by a discharge heating melting method while spreading it from an upper side of the silica container and further forming a layer made of transparent silica glass on a surface portion of an inner layer of the silica container at least after the discharge heating melting step and before formation of the grooves.

Furthermore, in the method for manufacturing a single-crystal silicon pulling silica container according to the present invention, it is preferable that, at the discharge heating melting step, the temporary compact is depressurized from an outer side of the mold to degas the temporary compact.

Based on such a process, when the silica container before forming the grooves is fabricated, it is possible to fabricate the silica container having the outer layer made of the opaque silica glass and the inner layer made of the transparent silica glass at low cost.

Moreover, it is preferable that, at the discharge heating melting step, an inert mixed gas containing 1 to 10% by volume of a hydrogen gas is supplied from an inner side of the temporary compact.

When such a gas is supplied in the discharge heating melting process, the inner layer made of the transparent silica glass with less gaseous bubbles can be obtained.

Additionally, it is preferable that a distal end cross-sectional shape of a rotary grinding plate of a groove formation grinder used in formation of the grooves has any one of a V-like shape, a U-like shape, and a rectangular shape.

When the grinder having such a shape is used, the cross-sectional shape can be any one of the V-like shape, the U-like shape, and the rectangular shape, and the grooves having such a cross-sectional shape enable more efficiently releasing the gaseous bubbles to the outside of the silicon melt.

Effect of the Invention

According to the single-crystal silicon pulling silica container of the present invention, the argon (Ar) gas contained in the silicon melt or the silicon monoxide (SiO) gas generated when the molten silicon reacts with the silica container surface during manufacture of the single-crystal silicon, moves up along the continuous grooves on the inner surface of the silica container with growth of the gaseous bubble diameter, and it is released to the outside of the melt from the periphery of the straight body portion of the silica container. As a result, the single-crystal silicon having less voids or pinholes can be manufactured. Furthermore, according to the method for manufacturing a single-crystal silicon pulling silica container of the present invention, such a silica container can be manufactured at low cost.

BEST MODE(S) FOR CARRYING OUT THE INVENTION

Figure 1:
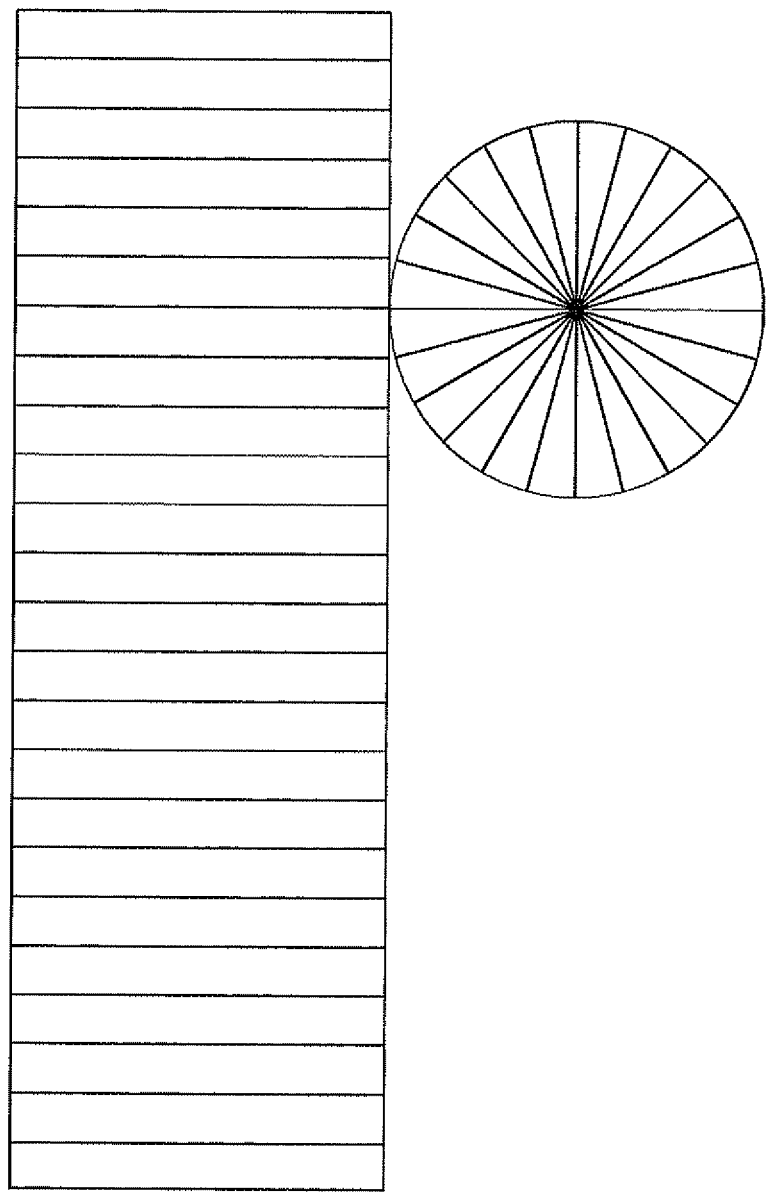
FIG. 1 is a schematic view schematically showing an example of a pattern of grooves formed on a silica container according to the present invention as a side development view and a top view.

Since a size of a single-crystal silicon pulling silica container is increased and a weight of a polysilicon raw material filling the inside of the container is also increased due to realization of a large diameter of single-crystal silicon to be manufactured, there occurs a problem that gaseous bubbles contained in a silicon melt remains in the melt, these gaseous bubbles are taken into the single-crystal silicon during manufacture, and many defects called voids or non-pierced small-diameter holes (pinholes) are produced in the single-crystal silicon. A cause of these defects is assumed to be an supplied atmospheric gas such as argon (Ar) adsorbed on an inner surface of the silica container during manufacture of the single-crystal silicon, and is assumed to be the silicon monoxide (SiO) gas generated when the silica container and silicon (Si) molten in the container react with each other. It is an object of the present invention to reduce the defects called voids or pinholes in the manufactured single-crystal silicon.

As described above, the present invention must solve the above-described technical problem at lower cost equal to or below that of a high-purity single crystal silicon pulling crucible according to the conventional manufacturing method.

Further, a silica container for manufacture of an LSI or solar single crystal silicon requires soaking properties in the container in a heating high-temperature atmosphere. Therefore, the silica container is provided with at least double structure, a porous opaque silica sintered body is used for the outer side, and a transparent silica glass body substantially containing no gaseous bubbles is used for the inner side.

Furthermore, when an impurity metal element contained in the silica container at the time of manufacture of single-crystal silicon, e.g., not only an alkali metal element Li, Na, or K but also Ti, V, Cr, Fe, Co, Ni, Cu, Zn, Mo, or W in particular is taken into the single-crystal silicon, photoelectric conversion efficiency is reduced in, e.g., a solar silicon device. Therefore, it is preferable to increase purity of an inner surface of the silica container so that the impurity contained in the silica container does not diffuse to the silicon melt.

A single-crystal silicon pulling silica container and a manufacturing method thereof according to the present invention will now be described hereinafter with reference to the drawings, but the present invention is not restricted thereto. In particular, as an example to which the present invention can be preferably applied, a description will be mainly given as to a silica container (a solar grade crucible) that can be used as a container for melting a metal silicon that can be a material for a photovoltaic cell (photovoltaic power generation, solar electric generation) and a manufacturing method thereof, but the present invention is not restricted thereto, and it can be likewise applied to, e.g., pulling single-crystal silicon for a large-scale integrated circuit (LSI).

Figure 5:
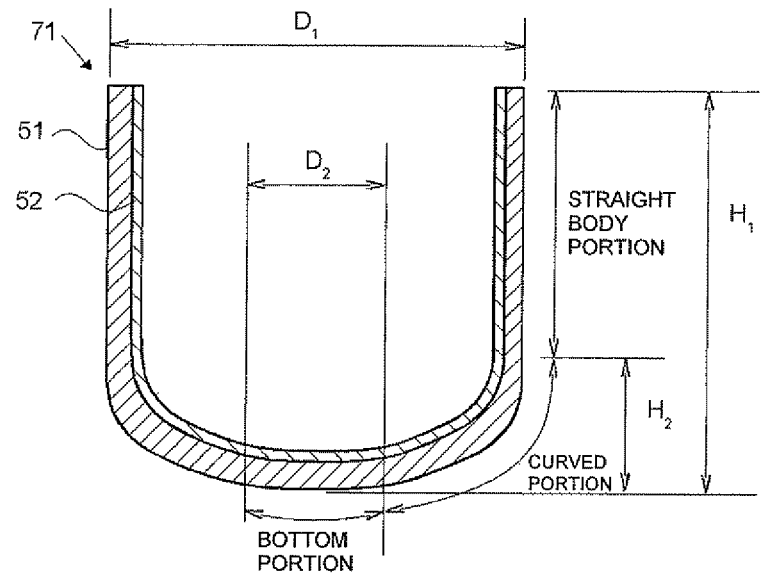
FIG. 5 is a schematic cross-sectional view showing a position at which a groove is formed in the silica container according to the present invention.

The single-crystal silicon pulling silica container according to the present invention will now be described with reference to FIG. 5. As shown in FIG. 5, a silica container 71 according to the present invention has an outer layer 51 made of opaque silica glass containing gaseous bubbles and an inner layer 52 made of transparent silica glass that does not substantially contain gaseous bubbles. Further, the silica container 71 has a bottom portion, a curved portion, and a straight body portion. At this time, ⅓ ($D_2$) of an outer diameter ($D_1$) of the silica container 71 is determined as a diameter of the bottom portion. Furthermore, the lowest portion, which is ⅓ of a height ($H_1$) of the silica container 71 to the bottom portion (a height $H_2$), excluding the bottom portion is determined as the curved portion. In the silica container according to the present invention, continuous grooves are formed on the surface of the inner layer 52 from at least part of the bottom portion to part of the straight body portion through the curved portion.

If such grooves as those used in the single-crystal silicon pulling silica container according to the present invention are not provided, it can be considered that a greater portion of the argon (Ar) gas contained in the silicon melt and a greater portion of the silicon monoxide (SiO) gas generated when the molten silicon reacts with the silica container surface during manufacture of the single-crystal silicon are generated as small gaseous bubbles that adhere to the inner surface of the silica container, a gaseous bubble diameter is then gradually increased, and the gaseous bubbles move up in the silicon melt with an increase in buoyancy of the gaseous bubbles. At this time, the gaseous bubbles move up along the container inner surface while adhering to the inner surface of the silica container, and the single-crystal silicon is not affected if the gaseous bubbles are released to the outside of the silicon melt. However, if the gaseous bubbles move away from the inner surface of the silica container and they are contained in a central region of the silicon melt circulated by convection, they are taken into the single-crystal silicon and produce voids or pinholes.

In the present invention, since the grooves that are continuous from at least part of the bottom portion to at least part of the straight body portion through the curved portion are formed on the surface of the inner layer, presence of the continuous grooves enables the argon gas or the SiO gas in the silicon melt to adhere to the inner surface of the silicon container during manufacture of the single-crystal silicon move up along the continuous grooves on the inner surface, and the gas is released to the outside of the melt. Moreover, the silicon monoxide (SiO) gas generated when the silicon melt and silica react with each other is generated as small bubbles in the continuous grooves on the inner surface of the silica container at the beginning, buoyancy of this gas is increased with growth of a gaseous bubble diameter, the gaseous bubbles move up along the continuous grooves on the inner surface, and they are released to the outside.

In order to allow the gaseous bubbles adhering to the inner surface of the container to efficiently move up along the inner surface, it is preferable to form the continuous grooves in a netlike pattern or a radial pattern on the bottom portion and the curved portion of the silica container, the radial pattern being centered on a center of the bottom portion.

Figure 2:
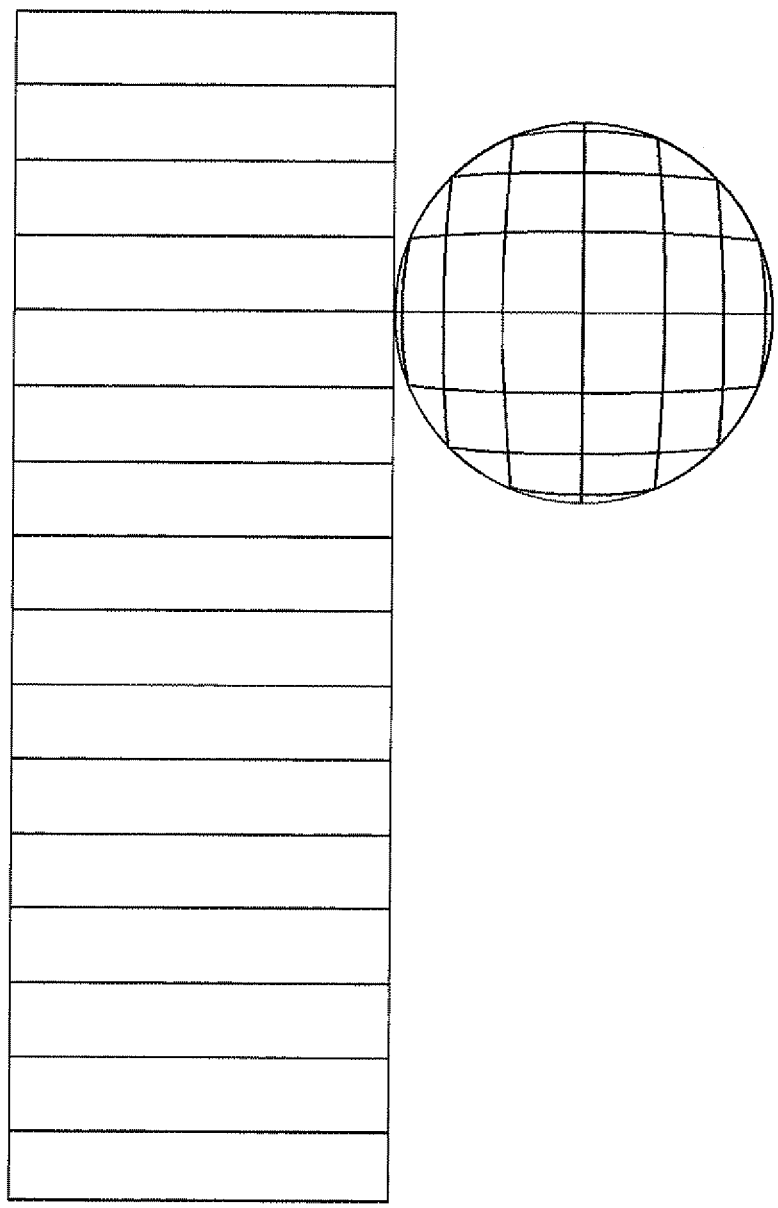
FIG. 2 is a schematic view schematically showing another example of the pattern of the grooves formed on the silica container according to the present invention as a side development view and a top view.
Figure 3:
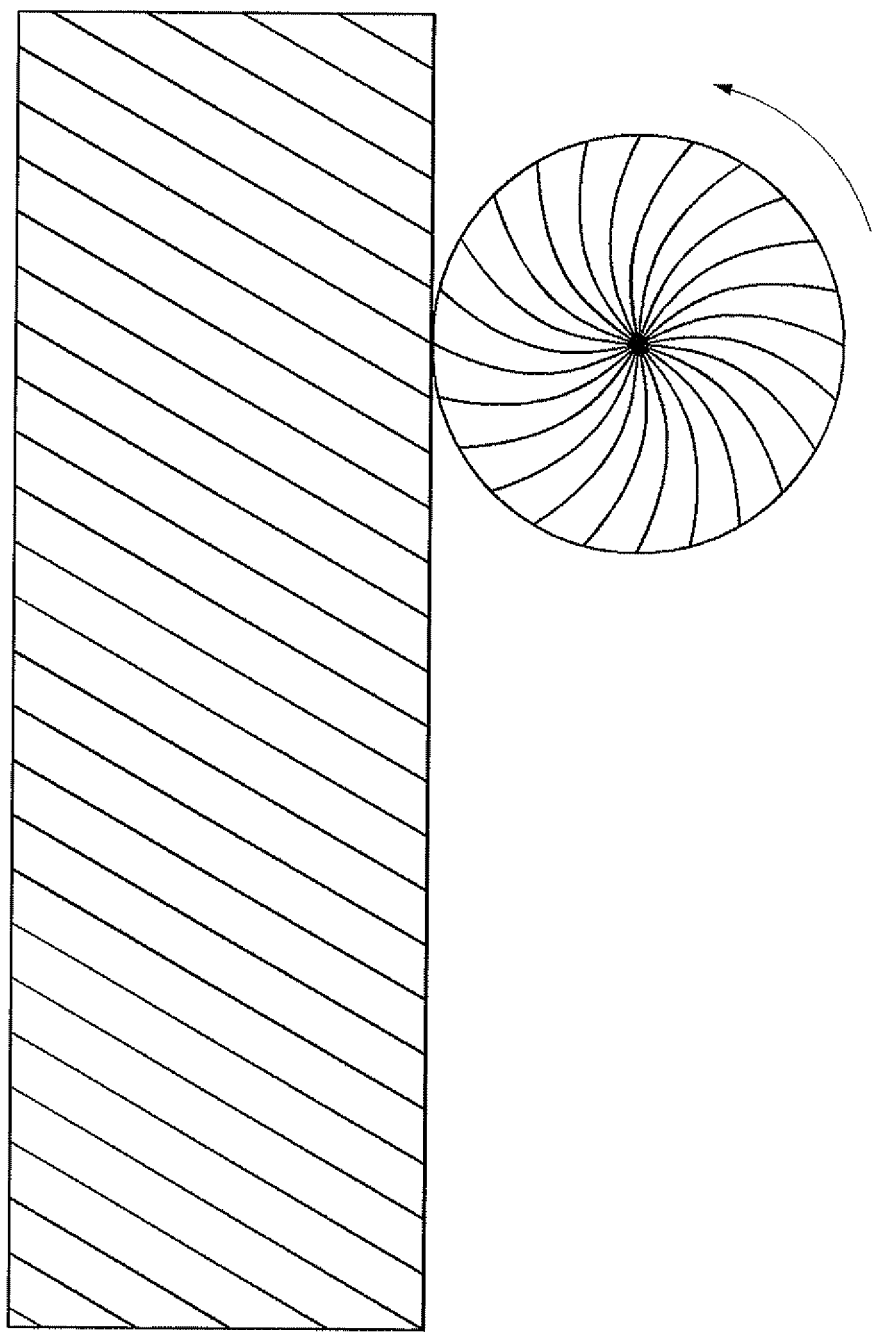
FIG. 3 is a schematic view schematically showing still another example of the pattern of the grooves formed on the silica container according to the present invention as a side development view and a top view.

FIGS. 1 to 3 schematically show examples of the pattern of the continuous grooves formed on the inner layer surface of the silica container according to the present invention as development views. However, a crucible which is constituted of curved surfaces and has a three-dimensional shape is just shown in a planar view, the grooves cannot be actually developed in this manner. In each of FIGS. 1 to 3, a pattern in a rectangular on the left side is shown as a development view in which a pattern of grooves formed from the straight body portion to part of the curved portion is shown from a side surface, and a pattern in a circle on the right side is shown as a view in which a pattern of grooves formed from the bottom portion to part of the curved portion is shown from a top face. It is preferable for the pattern of the grooves to be a pattern having high symmetric properties as shown in each of FIGS. 1 to 3.

FIG. 1 shows an example where a radial pattern having the center of the bottom portion as its center is formed on the bottom portion and the curved portion of the silica container. The radial pattern (24 grooves in FIG. 1) having the center of the bottom portion as its center is continuous with the grooves on the straight body portion.

FIG. 2 shows an example where a netlike pattern is formed in the bottom portion and the curved portion of the silica container. The respective grooves forming the netlike pattern on the bottom portion and the curved portion are continuous with grooves on the straight body portion.

FIG. 3 shows another example where a radial pattern having the center of the bottom portion as its center is formed on the bottom portion and the curved portion of the silica container. The radial pattern having the center of the bottom portion as its center is continuous with grooves on the straight body portion.

As shown in FIG. 3, the radial pattern may not be linear as seen from the upper side of the crucible, and it may be a helix pattern. In particular, it is preferable for the pattern to be parallel to rotation of the crucible at the time of manufacture of the single-crystal silicon. For example, the pattern shown in FIG. 3 is preferable when the crucible rotates in a counter-clockwise direction (a direction of an arrow in FIG. 3).

Figure 4:
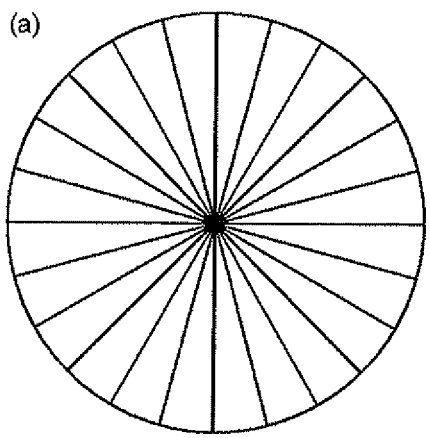
FIG. 4 is a view schematically showing modifications of the pattern of the grooves formed on the silica container according to the present invention in top views alone.
Figure 4:
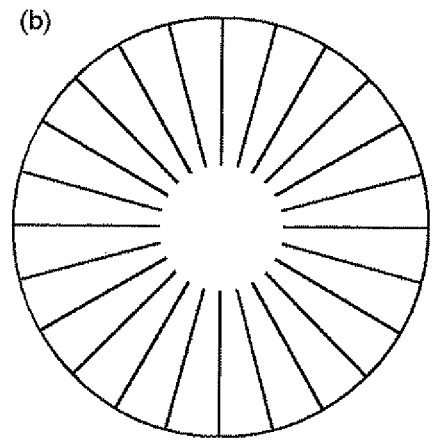
Figure 4:
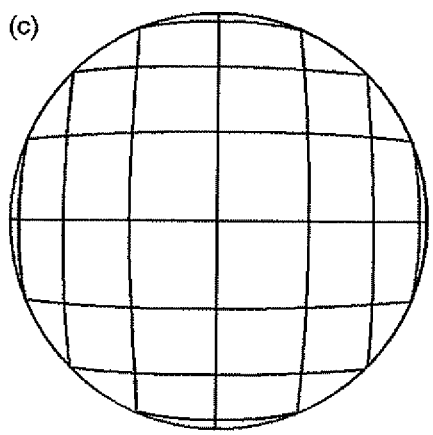
Figure 4:
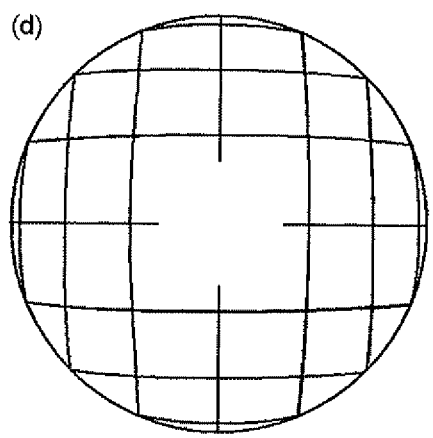
Figure 4:
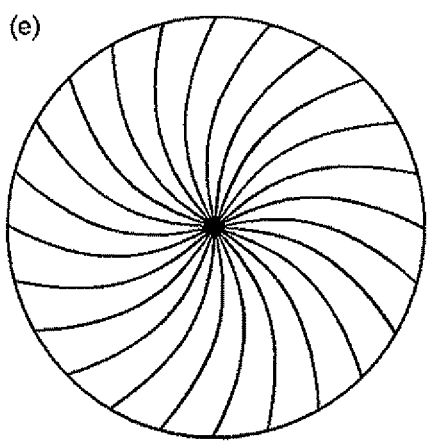
Figure 4:
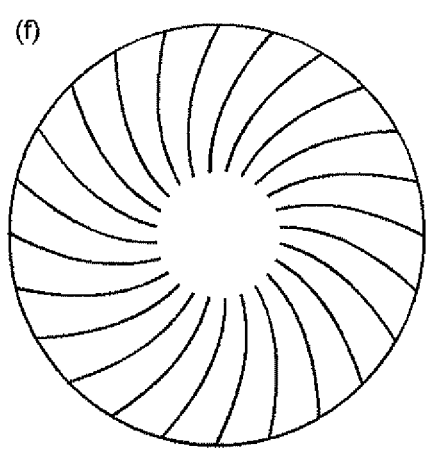

FIG. 4 shows top views each of which schematically shows a modification of the groove pattern formed in the silica container according to the present invention. The groove patterns shown in FIGS. 4(a), (b), and (c) are associated with the groove patterns in FIGS. 1 to 3. The grooves formed on the inner layer surface of the silica container according to the present invention may be formed to reach the center of the bottom portion of the silica container as shown in FIGS. 4(a), (c), and (e), but they may not be formed at a central part of the bottom portion of the silica container as shown in FIGS. 4(b), (d), and (f). Moreover, some of the plurality of continuous grooves may be formed to reach the center of the bottom portion of the silica container, and the remaining grooves may not be formed in the central part of the bottom portion of the silica container.

When the grooves are formed to reach the center of the bottom portion of the silica container, the gaseous bubbles generated in the bottom portion of the silica container can be also released to the outside of the silicon melt along the continuous grooves. This is suitable for a container having a relatively round bottom shape. On the other hand, when the grooves are not formed at the central part of the bottom portion of the silica container, since the grooves are not present immediately below the single-crystal silicon to be pulled, the gaseous bubbles are preferentially generated in or allowed to adhere to the grooves formed around the central part of the bottom portion of the groove rather than this central part, and hence an amount of the gaseous bubbles that are taken into the single-crystal silicon may be reduced in some cases. This is suitable for a container that has a relatively flat bottom shape.

It is preferable for each continuous groove to fall within the range of 0 to 45° relative to a vertical line (that is, a perpendicular line relative to a silicon melt surface) in the straight body portion. Each of FIGS. 1 and 2 shows a case where this angle (an inclined angle) is 0°. FIG. 3 shows a case where this angle is 30°. It is preferable for the inclined angle of each groove in the straight body portion to be parallel to rotation of the crucible at the time of manufacture of the single-crystal silicon. For example, the pattern in FIG. 3 is preferable when the crucible rotates in the counterclockwise direction.

It is preferable to form each continuous groove so that it reaches a portion above a position of the silicon melt surface and more preferable to form the same so that it reaches an upper edge of the straight body portion of the silica container. If the grooves are formed to reach the upper edge of the straight body portion of the silica container, the gaseous bubbles can be assuredly released to the outside of the silicon melt irrespective of the silicon melt accommodated in the container.

Figure 6:
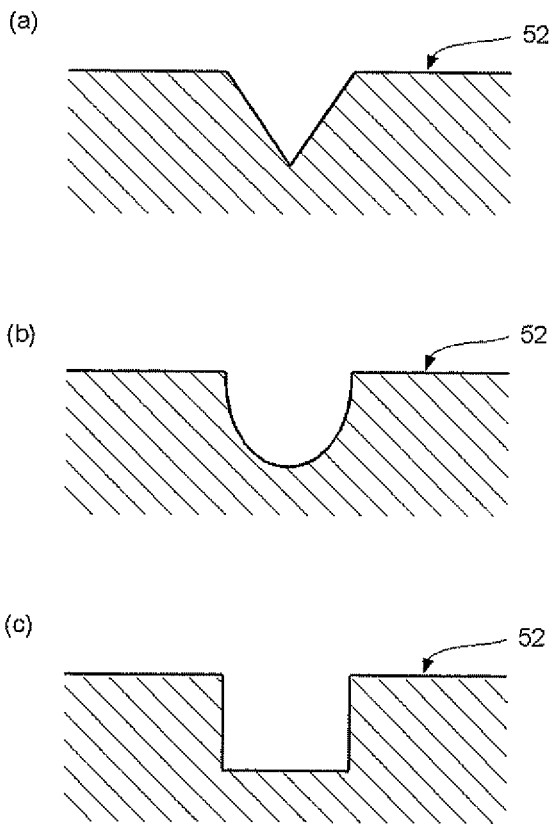
FIG. 6 is cross-sectional views each showing a cross-sectional shape of the groove formed in the silica container according to the present invention.

Further, as the cross-sectional shape of each groove, any one of a V-like shape, a U-like shape, and a rectangular shape is preferable in order to efficiently release the gaseous bubbles to the outside of the silicon melt. FIG. 6 shows cross-sectional shapes of each groove formed in the silica container according to the present invention. Each of FIGS. 6(a) and (b) shows an example where the groove having the V-like shape or the U-like shape is formed on the surface of the inner layer 52 in the silica container. FIG. 6(c) shows an example where the groove having the rectangular shape is formed on the surface of the inner layer 52 of the silica container, and this shape is also referred to as a concave shape, a box shape, or an angular shape.

It is preferable for the grooves having the cross-sectional shapes shown in FIG. 6 to have a width of 10 to 1000 μm and a depth of 10 to 1000 μm in the cross-sectional shape. If these dimensions fall within such a range, the gaseous bubbles in the silicon melt can be more effectively released to the outside of the silicon melt. Furthermore, it is more preferable to set the width and the depth of each groove to 500 to 1000 μm and 500 to 1000 μm, respectively.

It is preferable to form the grooves at intervals (a pitch) falling in the range of 1 to 30 mm at least in the straight body portion. It is more preferable for the intervals of the grooves to be 3 to 10 mm. Moreover, it is preferable for the intervals to be substantially equal intervals in the straight body portion.

Additionally, the single-crystal silicon pulling silica container 71 according to the present invention has the outer layer 51 made of the opaque silica glass containing the gaseous bubbles and the inner layer 52 made of the transparent silica glass that does not substantially contain the gaseous bubbles. When the silica container 71 has such an outer layer 51 and an inner layer 52, soaking properties in the silica container at the time of heating can be improved. Bulk density of the outer layer 51 can be set to, e.g., 1.90 to 2.20 (g/cm$^3$), and bulk density of the inner layer 52 can be typically set to approximately 2.20 (g/cm$^3$), but the present invention is not restricted thereto in particular.

Further, OH group concentration in the outer layer 51 is preferably 10 to 300 ppm by mass, and Al concentration in the same is preferably 10 to 300 ppm by mass. Furthermore, OH group concentration in the inner layer 52 is preferably 1 to 100 ppm by mass, and Al concentration in the same is preferably 50 ppm by mass or less. When the outer layer 51 or the inner layer 51 contains the OH group and Al at such concentration, the contamination of impurities into the silicon melt can be reduced even though a raw material powder serving as a raw material of the silica container is inexpensive and has low purity.

For example, even if the purity is such low as that the outer layer 51 contains 5 to 50 ppm by mass as a total value of alkali metal elements Li, Na, and K, adsorption and fixation of the alkali metal elements can be carried out by allowing the outer layer 51 to preferably contain 10 to 300 ppm by mass or more preferably contain 20 to 50 ppm by mass of Al. Furthermore, impurity adsorption and fixation effects can be greatly improved by allowing the outer layer 51 to contain 10 to 300 ppm by mass or more preferably contain 1 to 100 ppm by mass of the OH group. Besides, as an effect obtained when Al is contained, viscosity of silica glass at a high temperature is increased, and heat deformation of the silica container at a high temperature is improved. An increase in the OH group concentration lowers the viscosity of the silica glass, and hence 100 ppm by mass or less is preferable.

The Al concentration in the inner layer 52 is preferably 50 ppm by mass or less as described above. When such concentration is set in the inner layer that is in contact with the silicon melt, the single-crystal silicon can be prevented from being contaminated by the Al itself, and the effect of adsorbing and fixing the alkali metal elements by Al can be obtained.

The OH group concentration in the inner layer 52 is preferably 1 to 100 ppm by mass as described above. Although the OH group has an effect to reduce a diffusion rate of the impurity metal elements, it also has an adverse effect to reduce etching resistance properties (insolubility with respect to the silicon melt), and hence an optimal concentration range is limited in the inner layer 52 that comes into contact with the silicon melt.

Although particulars of a mechanism that Al and the OH group prevent movement and diffusion of the impurity metal elements in the silica glass has not yet known, it can be considered that Al adsorbs positive ions (cations) of the impurity metal elements and suppresses diffusion of them in order to keep electric charge balance of a silica glass network when Al is replaced by Si. Further, it can be considered that the OH group has an effect of adsorbing the impurity metal elements or suppressing diffusion of the impurity metal elements when hydrogen ions are replaced by metal ions.

It is preferable for the inner layer 52 to have small content of the impurity metal elements and to have high purity. When each of Li, Na, and K as the impurity metal elements in the inner layer 52 is set to 60 ppb by mass or less and each of Ti, V, Cr, Fe, Co, Ni, Cu, Zn, Mo, and W in the same is set to 30 ppb by mass or less or, more preferably, when each of Li, Na, and K is set to 20 ppb by mass or less and each of Ti, V, Cr, Fe, Co, Ni, Cu, Zn, Mo, and W is set to 10 ppb by mass or less, quality of the single-crystal silicon can be improved.

The above-described silica container 71 can be manufactured as follows. A method for manufacturing a single crystal silicon pulling silica container according to the present invention will now be specifically described.

First, the silica powder is melted by heat to fabricate such a silica container 71 as shown in FIG. 5 which has the outer layer 51 made of the opaque silica glass containing gaseous bubbles and the inner layer 52 made of the transparent silica glass that does not substantially contain gaseous bubbles, and which has the bottom portion, the curved portion, and the straight body portion. Then, the grooves that are continuous from at least part of the bottom portion to at least part of the straight body portion through the curved portion are formed on the surface of the inner layer 52.

A specific method for manufacturing the silica container 71 before forming the grooves will now be described with reference to FIGS. 7 and 8.

Figure 7:
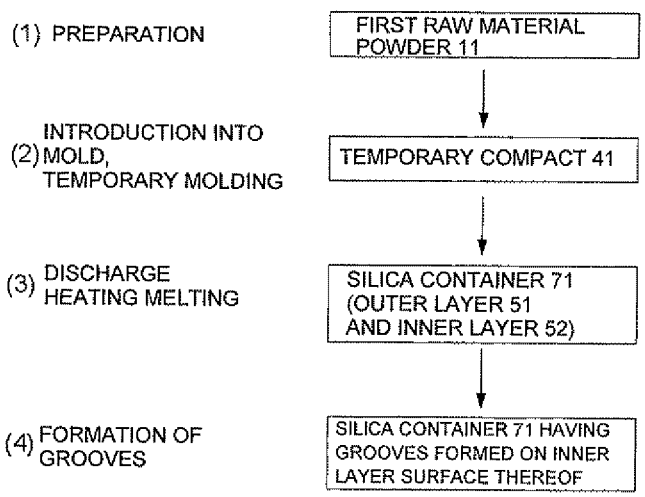
FIG. 7 is a flowchart showing an outline of an example of a method for manufacturing a silica container according to the present invention.

First, as shown in (1) of FIG. 7, a silica powder having a particle size of 10 to 1000 µm is fabricated as a first raw material powder 11. Although this first raw material powder 11 can be fabricated by, e.g., pulverizing and sizing a block of silica as follows, the present invention is not restricted thereto.

First, a block of natural silica (crystal, quartz, silica, siliceous stones, opal stones, and others which are naturally yielded) having a diameter of approximately 5 to 50 mm is heated in an air atmosphere in a temperature region of 600 to 1000° C. for approximately 1 to 10 hours. Then, the block of natural silica is put into water, precipitously cooled, then taken out, and dried. This treatment can facilitate a subsequent treatment of pulverization and sizing using a crusher or the like, but the processing may advance to a pulverization treatment without performing this heating and precipitous cooling treatment.

Subsequently, the block of natural silica is pulverized and sized with use of a crusher or the like, and its particle size is preferably adjusted to 10 to 1000 µm or more preferably 50 to 500 µm, thereby obtaining a natural silica powder. Then, this natural silica powder is put into a rotary kiln constituted of a silica glass tube having an inclined angle, a hydrogen chloride (HCl) or chlorine ($Cl_2$) gas containing atmosphere is provided in the kiln, and a purification treatment is carried out by performing heating at 700 to 1100° C. for approximately 1 to 100 hours. However, in a product use application that does not require high purity, the processing may advance to a subsequent treatment without performing this purification treatment.

Although the first raw material powder 11 obtained after the above-described process is crystalline silica, amorphous silica glass scraps may be used as the first raw material powder 11 depending on a user application of the silicon container.

A particle size of the first raw material powder 11 is preferably set to 10 to 1000 µm and more preferably set to 50 to 500 µm. Silica purity of the first raw material powder 11 is preferably set to 99.99% by mass or more, or it is more preferably set to 99.999% by mass or more. Furthermore, according to the method for manufacturing a silica container of the present invention, even if the silica purity of the first raw material powder 11 is as relatively low as less than 99.999% by mass, the silica container to be manufactured can sufficiently prevent impurity contamination with respect to accommodated matters. Therefore, the silica container can be manufactured at lower cost than those in conventional examples.

It is to be noted that the first raw material powder 11 may contain Al preferably in the range of 10 to 300 ppm by mass. Al can be obtained by using a water or alcohol solution of, e.g., a nitrate, an acetate, a carbonate, a chloride, or the like, putting and immersing the silica powder in such a solution, and then performing drying.

Figure 9:
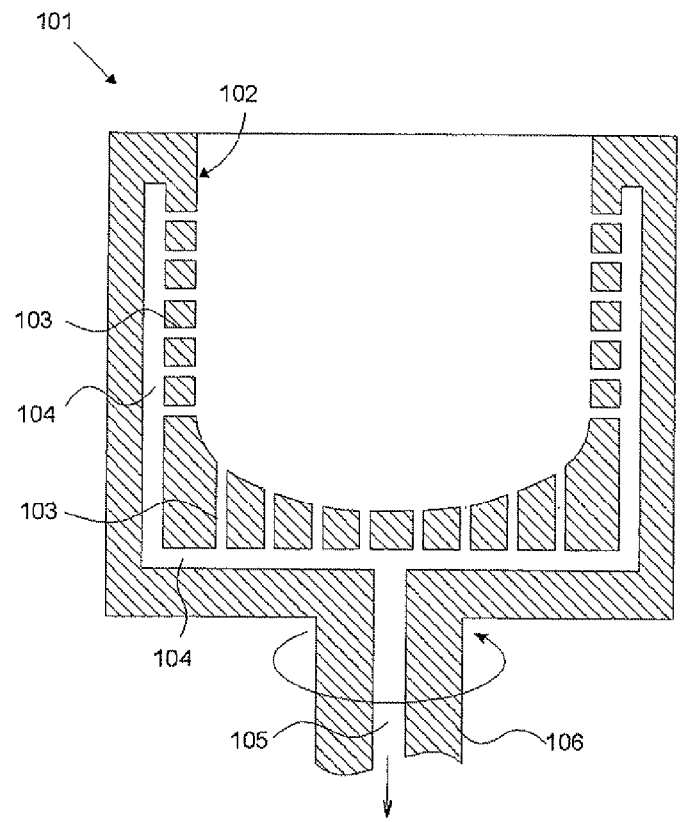
FIG. 9 is a schematic cross-sectional view showing an example of a mold that can be used in the method for manufacturing a silica container according to the present invention.

After the first raw material powder 11 is fabricated as described above, as shown in (2) of FIG. 7, the first raw material powder 11 is then put into a mold having rotational symmetry, and it is temporarily molded into a predetermined shape associated with an inner wall of the mold while rotating the mold, thereby obtaining a temporary compact. FIG. 9 is a cross-sectional view showing an outline of the mold used for temporarily molding the first raw material powder 11. A mold 101 used in the present invention is constituted of a member of graphite or the like and has rotational symmetry. Moreover, pressure-reducing holes 103 may be distributed and formed in an inner wall 102 of the mold 101. The pressure-reducing holes 103 are continuous with a pressure-reducing path 104. Additionally, a pressure-reducing path 105 also runs through a rotary shaft 106 configured to rotate the mold 101, and vacuum drawing can be carried out from this path.

Figure 10:
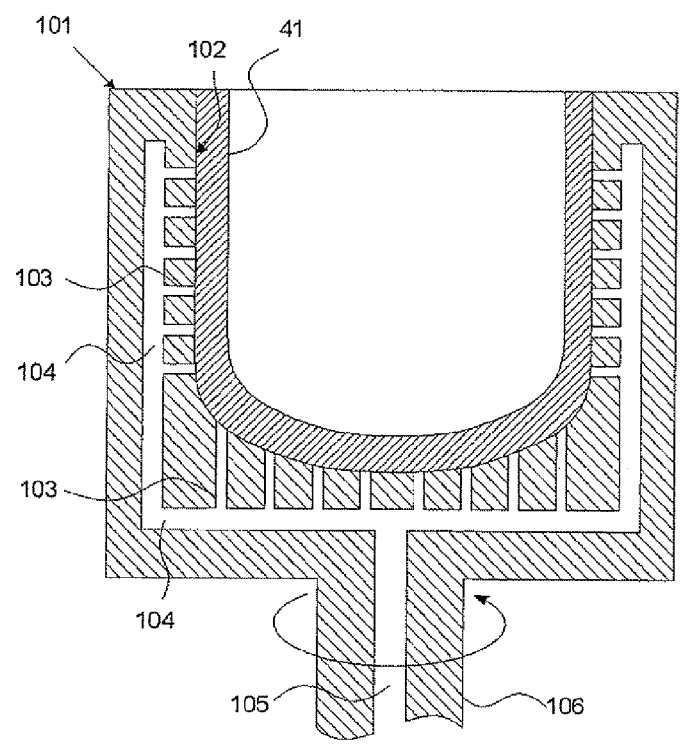
FIG. 10 is a schematic cross-sectional view schematically showing an example of a process for forming a temporary compact in the method for manufacturing a silica container according to the present invention.

The first raw material powder 11 is introduced to the inner wall 102 of this mold 101, and the first raw material powder 11 is temporarily molded into a predetermined shape associated with the inner wall 102 of the mold 101, thus obtaining a temporary compact 41 (see FIG. 10). Specifically, the first raw material powder 11 is gradually put to the inner wall 102 of the mold 101 while rotating the mold 101, and it is molded into a container shape by utilizing centrifugal force. Further, a tabular inner mold (not shown) is brought into contact with the rotating powder body from the inner side, whereby a thickness of the temporary compact 41 may be adjusted to a predetermined amount. Furthermore, although a method for supplying this first raw material 11 to the mold 101 is not restricted in particular, for example, a hopper including an agitating screw and a measuring feeder may be used. In this case, the first raw material 11 that has filled the hopper is agitated by using the agitating screw, and it is supplied while adjusting a supply mount by using the agitating screw and the measuring feeder.

Figure 11:
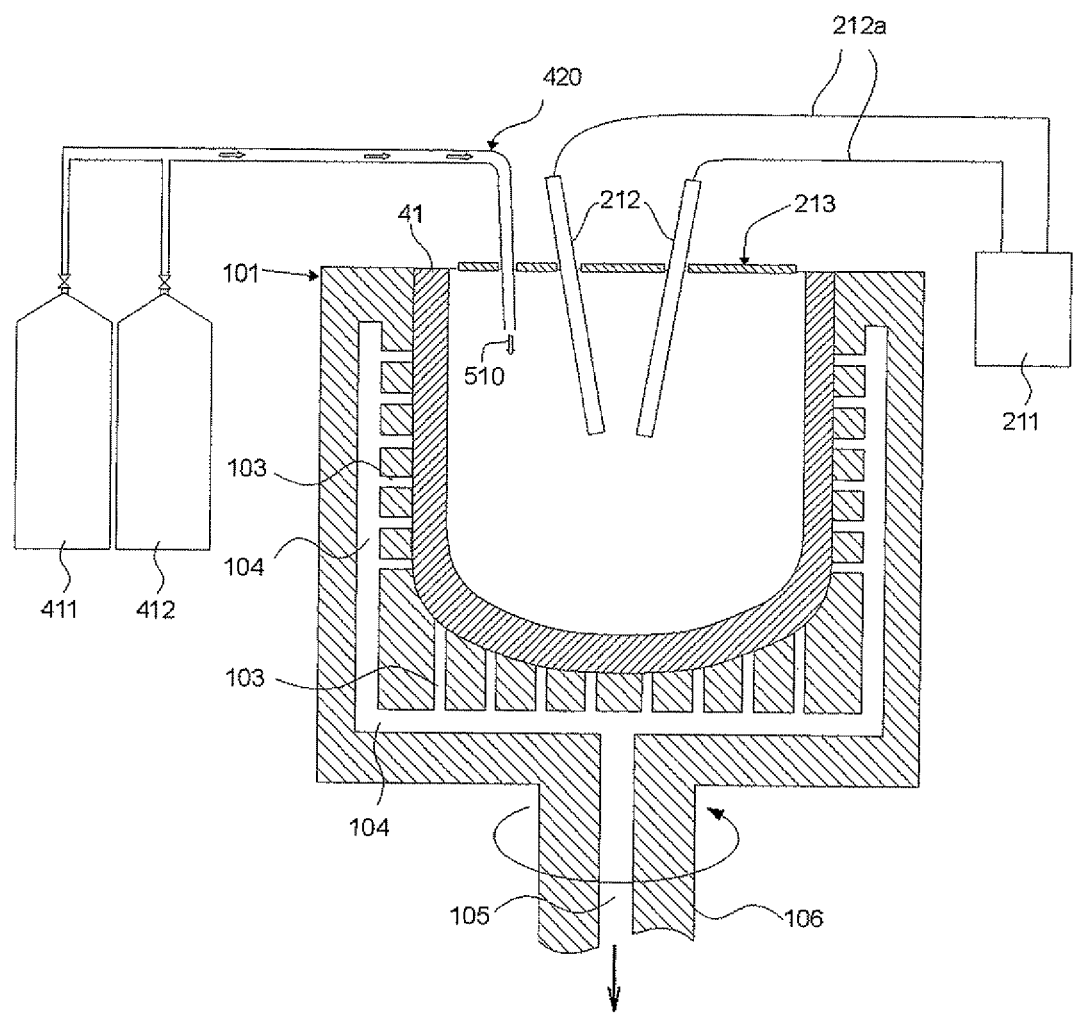
FIG. 11 is a schematic cross-sectional view schematically showing part (before discharge heating melting) of an example of a discharge heating process in the method for manufacturing a silica container according to the present invention.
Figure 12:
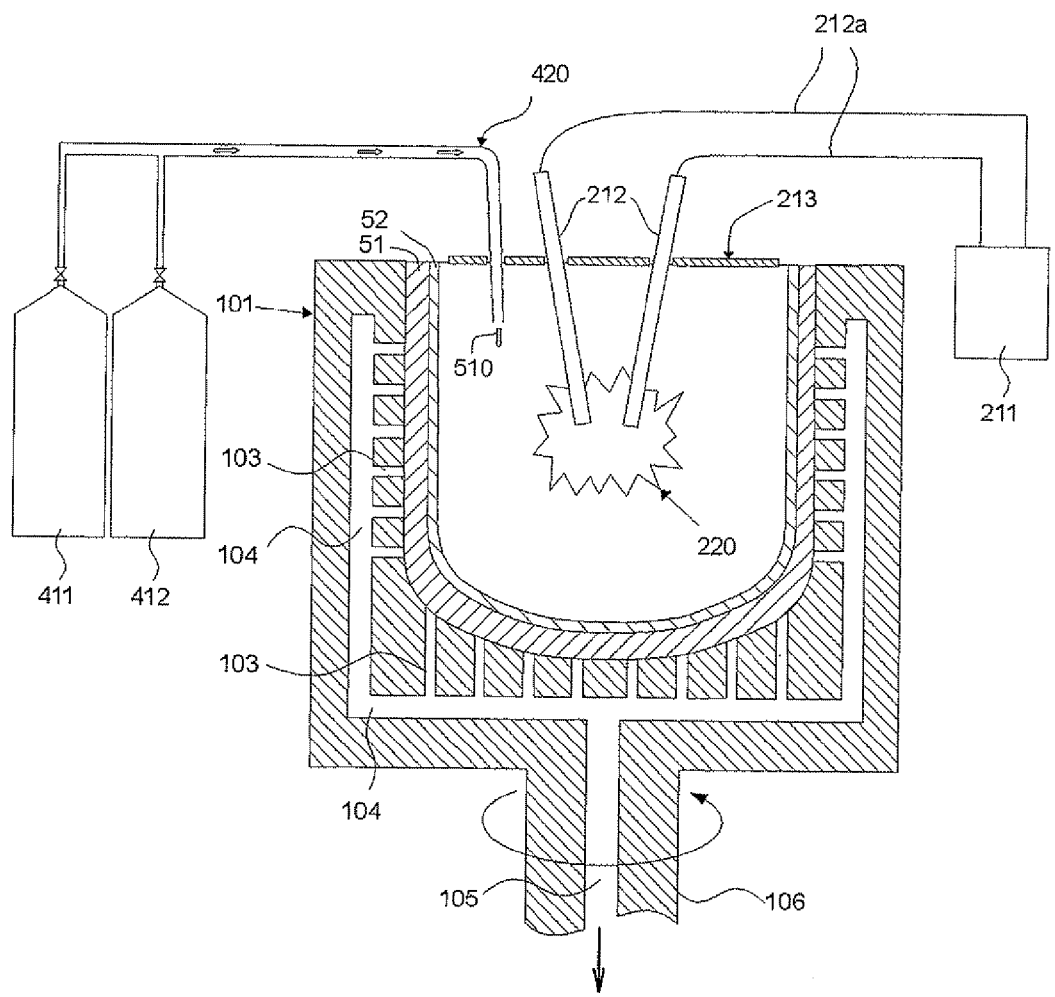
FIG. 12 is a schematic cross-sectional view schematically showing part (during discharge heating melting) of the example of the discharge heating process in the method for manufacturing a silica container according to the present invention.

Then, as shown in (3) of FIG. 7, carbon electrodes are placed in the temporary compact 41, the temporary compact 41 is heated and molten by the discharge heating melting method so that at least an outer portion of the temporary compact 41 is turned to an outer layer 51 made of opaque silica glass and an inner portion of the same is turned to an inner layer 52 made of transparent silica glass. Specifically, as shown in FIG. 11 and FIG. 12, it is preferable to perform depressurization through the pressure-reducing holes 103 formed in the mold 101 so that the temporary compact 41 can be subjected to depressurization and degassing from the outside of the mold 102 and to carry out heating from the inside of the temporary compact by the discharge heating fusing method. As a result, an outer peripheral portion of the temporary compact 41 can be formed into a sintered body, and an inner portion of the temporary compact is formed into a molten glass body, thus fabricating the silica container 71.

An apparatus configured to fabricate the silica container 71 comprises the rotatable mold 101 having the rotational symmetry, a rotary motor (not shown), carbon electrodes 212 that can function as a heat source of discharge heating melting (which is also referred to as arc melting or arc discharge melting), electric wires 212*a*, a high-voltage power supply unit 211, a lid 213, and others. Further, it also comprises constituent members configured to check an atmospheric gas supplied from the inner side of the temporary compact, e.g., a hydrogen gas supply cylinder 411, an inert gas supply cylinder 412, a mixed gas supply tube 420, and others.

It is to be noted that this apparatus can be continuously used in case of further forming a layer made of transparent silica glass on a surface portion of the inner layer as will be described later.

As a melting and sintering procedure of the temporary compact 41, before starting application of a voltage between the carbon electrodes 212, it is preferable to start supplying a mixed gas including an inert gas that contains 1 to 10% by volume of a hydrogen gas from the inner side of the temporary compact 41. Specifically, as shown in FIG. 11, the hydrogen gas is supplied from the hydrogen gas supply cylinder 411, the inert gas (e.g., nitrogen ($N_2$), argon (Ar), or helium (He)) is supplied from the inert gas supply cylinder 412, these gases are mixed, and a mixture is supplied from the inner side of the temporary compact 41 through the mixed gas supply tube 420. It is to be noted that each outline arrow indicated by reference numeral 510 represents a flow of the mixed gas.

Then, in a state that supply of the mixed gas is continued, the mold 101 having the temporary compact 41 therein is rotated at a fixed rate, a degassing vacuum pump (not shown) is activated, depressurization is carried out from the outer side of the temporary compact 41 via the pressure-reducing holes 103 and the pressure-reducing paths 104 and 105, and application of a voltage between the carbon electrodes 212 is started.

When arc discharge (denoted by reference numeral 220) begins between the carbon electrodes 212, a melting temperature region (which is assumed to be approximately 1800 to 2000° C.) of the silica powder is formed in the inner surface portion of the temporary compact 41, and melting starts from the outermost layer portion. When the outermost surface portion is molten, a depressurization degree of vacuum drawing effected by the degassing vacuum pump increases (a pressure is precipitously lowered), and a change into a molten silica glass layer advances from the inner side toward the outer side while releasing a dissolved gas contained in the first raw material powder 11.

Furthermore, heating based on application of the voltage and depressurization using the vacuum pump are continued until approximately half of the total thickness of the temporary compact on the inner side is molten, the inner layer 52 constituted of the transparent silica glass layer is provided, and approximately remaining half of the same on the outer side is turned to the outer layer 51 made of the opaque silica glass. It is preferable to set the depressurization degree to $10^4$ Pa or less and more preferable to set the same to $10^3$ Pa or less.

It is to be noted that, in this discharge heating melting process, discharge heating can be carried out at a normal temperature without performing depressurization, the outer portion of the temporary compact 41 can be made of the opaque silica glass, and the inner portion of the same can be made of the transparent silica glass.

Although grooves can be formed in the silica container 71 formed by the above-described process, a layer made of the transparent silica glass can be further formed on the surface portion of the inner layer 52 of the silica layer 71 so as to increase a thickness of the inner layer before forming the grooves. This method will now be described with reference to FIG. 8.

Figure 8:
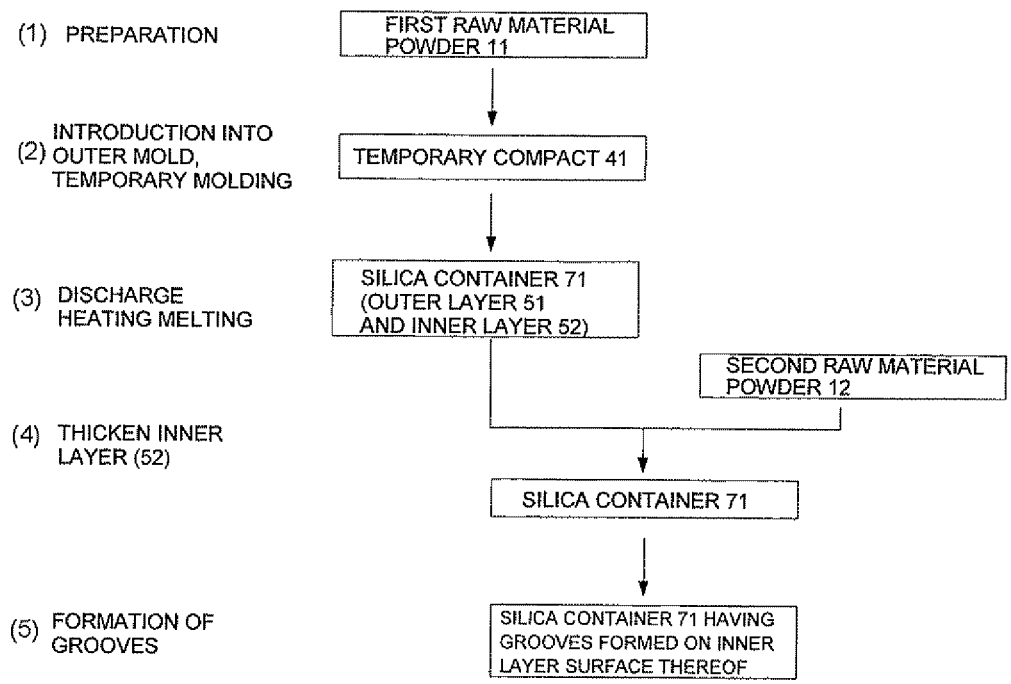
FIG. 8 is a flowchart showing an outline of another example of the method for manufacturing a silica container according to the present invention.

According to this method, like the steps 1 to 3 shown in (1) to (3) of FIG. 7, the process from the beginning to formation of the silica container 71 is performed (see FIGS. 8(1) to (3)). Aside from this process, as a second raw material powder 12, a silica powder 12 having a particle size of 10 to 1000 μm and higher purity that the first raw material powder 11 is fabricated. A method for fabricating the second raw material powder may be the same as that of the first raw material powder except raising the purity. Furthermore, as a material of the second raw material powder 12, it is possible to use a natural quartz powder, a natural crystal powder, a synthetic cristobalite powder, or a synthetic silica glass powder subjected to a purification treatment. A crystalline silica powder is preferable for the purpose of reducing an amount of gaseous bubbles in the inner layer, or a synthetic powder is preferable for the purpose of providing the inner layer made of high-purity transparent silica glass. It is preferable to set a particle size of the second raw material powder 12 to 100 to 500 μm. As purity of the second raw material powder 12, it is preferable to contain 99.9999% by mass or more of a silica component ($SiO_2$), 60 ppb by mass or less, which is more desirably 20 ppb by mass or less, of each of alkali metal elements Li, Na, and K, or 30 ppb by mass or less, which is more desirably 10 ppb by mass or less, of each of Ti, V, Cr, Fe, Co, Ni, Cu, Zn, Mo, and W.

Then, as shown in (4) of FIG. 8, a layer made of the transparent silica glass is formed by using the second raw material powder 12 on the surface portion of the inner layer 52 of the silica container 71 at least after the discharge heating melting process (after (3) of FIG. 8) and before formation of the grooves ((5) of FIG. 8), thereby increasing the thickness of the inner layer. This process is effected by spreading the second raw material powder 12 from the upper side of the silica container 71 and performing heating and melting based on the discharge heating melting method. A basic forming method of this process is conforming to, e.g., contents disclosed in Patent Literature 6 and Patent Literature 7.

Figure 13:
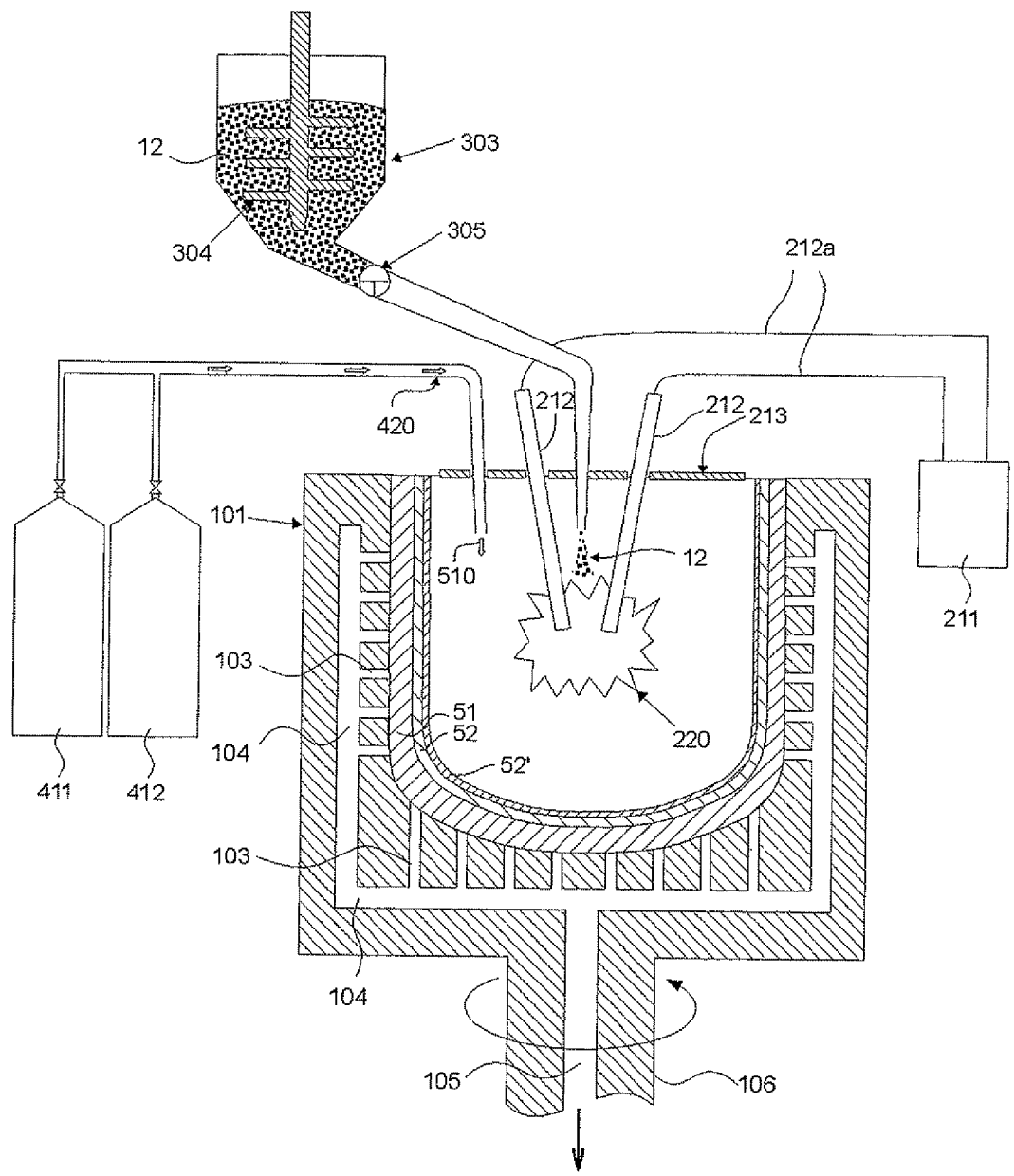
FIG. 13 is a schematic cross-sectional view schematically showing an example of a process for increasing a thickness of an inner layer in the method for manufacturing a silica container according to the present invention.

This process will now be described with reference to FIG. 13. Like the previous process, an apparatus configured to further form the layer made of the transparent silica glass on the surface portion of the silica container 71 comprises a rotatable mold 101 which has rotary shaft symmetry and has the silica container 71 placed therein, a rotary motor (not shown), a raw material powder hopper 303 having the second raw material powder 12 therein, an agitating screw 304, a measuring feeder 305, carbon electrodes 212 serving as a heat source of the discharge heating melting, electric wires 212*a*, a high-voltage power supply unit 211, a lid 213, and others. Moreover, in case of adjusting an atmospheric gas, like the discharge heating melting process (FIG. 8(3)), the hydrogen gas supply cylinder 411, the inert gas supply cylinder 412, the mixed gas supply tube 420, and others may be provided.

As a method for increasing the thickness of the inner layer 52, first, the mold 101 is set to a predetermined rotational speed, a high voltage is gradually applied from the high-voltage power supply unit 211 and, at the same time, the second raw material powder 12 is gradually spread from the upper side of the silica container 71 by using the raw material hopper 303. At this time, discharge between the carbon electrodes 212 has been already started, a melting temperature region (which is considered to be approximately 1800 to 2000° C.) of the silica powder is formed in the silica container 71, and hence the spread second raw material powder 12 adheres to the inner surface of the silica container 71 as molten particles of silica. The carbon electrodes 212, a raw material powder input opening, and the lid 213 disposed at an upper opening portion of the silica container 71 are mechanisms whose positions can be changed with respect to the silica container 71 to some extent, and changing these positions enables increasing the thickness of the inner layer 52 which is uniform on the entire inner surface of the silica container 71. It is to be noted that a portion of the inner layer 52 thickened with use of the second raw material powder 12 is represented as an inner layer (an additional layer) 52' in FIG. 13.

After the silica container 71 is fabricated in this manner, grooves are formed on the inner layer 52 of the silica container 71 (FIG. 7(4), FIG. 8(5)). As a method for forming continuous grooves, for example, a grinder having a diamond grinding plate which rotates at a high speed incorporated therein can be used. As the diamond grinding plate (a wheel), a metal bonded grinding plate having a diamond fixed by an alloy can be used at low cost, but a resin bonded grinding plate fixed by using a resin or vitrified bonded grinding plate fixed by multi-component-based glass can be used in order to avoid machining contamination on the inner surface of the container. Besides, a laser beam machine having a carbon dioxide ($CO_2$) laser or the like incorporated therein can be used. Since laser machining is a contactless machining method, it can avoid machining contamination on the inner surface of the silica container.

As described above, the single-crystal silicon pulling silica container 71 according to the present invention can be obtained.

EXAMPLES

The present invention will now be more specifically explained hereinafter based on examples and comparative examples of the present invention, but the present invention is not restricted thereto.

Example 1

A single-crystal silicon pulling silica container was manufactured based on the processes (1) to (4) shown in FIG. 7. A natural quartz powder that has silica ($SiO_2$) purity of 99.999% by mass or more and a particle size of 100 to 300 μm and that was doped with 50 ppm by mass of Al was prepared as the first raw material powder 11. As an atmospheric gas at the time of melting a temporary compact, a dried mixed gas containing 97% by volume of $N_2$ and 3% by volume of $H_2$ was used. Continuous grooves each having a V-like shape were formed in such a netlike pattern as shown in FIG. 2 and FIG. 4(c) on a surface of an inner layer of the silica container. A groove width was 700 μm, a groove depth was 600 μm, an angle relative to a vertical line of each groove in a straight body portion was 0°, and each groove interval was 20 mm in the straight body portion. Other conditions are written in Table 1.

Example 2

A silica container was manufactured like Example 1, and V-shaped grooves were formed on a surface of an inner layer of the silica container as shown in FIG. 1 except a bottom portion where the grooves were formed in such a radial pattern as shown in FIG. 4(b). A groove width was 700 μm, a groove depth was 600 μm, an angle relative to a vertical line of each groove in a straight body portion was 0°, and each groove interval was 15 mm in the straight body portion.

Example 3

A single-crystal silicon pulling silica container was manufactured based on the processes (1) to (5) shown in FIG. 8. A natural quartz powder that has silica purity of 99.999% by mass or more and a particle size of 100 to 300 μm and that was doped with 60 ppm by mass of Al was used as the first raw material powder. As a second raw material powder, a high-purity synthetic cristobalite powder having silica purity of 99.9999% by mass or more and a particle size of 100 to 300 μm was used. As an atmospheric gas at the time of melting, a dried mixed gas containing 90% by volume of He and 10% by volume of $H_2$ was used. U-shaped grooves were formed in such a radial (a radial vortex shape) pattern as shown in FIG. 3 and FIG. 4(e) on a surface of an inner layer of the silica container. A groove width was 700 μm, a groove depth was 500 μm, an angle relative to a vertical line of each groove in a straight body portion was 30°, and each groove interval was 10 mm in the straight body portion. Other conditions are written in Table 2.

Example 4

A first raw material powder doped with Al and a high-purity second raw material powder which are the same as those in Example 3 were used. Moreover, an atmospheric gas at the time of melting was also the same as that in Example 3. U-shaped grooves were formed on an inner surface portion of the silica container as shown in FIG. 3 except a bottom portion where the grooves were formed in such a radial (a radial vortex shape) pattern as shown in FIG. 4(f). A groove width was 700 μm, a groove depth was 500 μm, an angle relative to a vertical line of each groove in a straight body portion was 30°, and each groove interval was 15 mm in the straight body portion.

Comparative Example 1

As a first raw material powder, a natural quartz powder having silica purity of 99.999% by mass or more and a particle size of 100 to 300 μm was used. A temporary compact was molten based on the reduced-pressure arc discharge melting method. No groove was formed on an inner surface portion of the silica container.

Comparative Example 2

A first raw material powder was the same as that in Comparative Example 2, and a second raw material powder is the same as those in Examples 3 and 4. A temporary compact was molten by a normal-pressure arc melting method in air, and a technique for increasing a thickness of the inner layer was carried out by the normal-pressure arc melting method in air based on spreading of the second raw material powder. No groove was formed on an inner surface portion of the silica container.

[Evaluation Method in Examples and Comparative Examples]

The adopted raw material powders and gases and physical properties and characteristics of the silica containers manufactured in the respective examples and comparative examples were evaluated as follows.

Method for Measuring Particle Size of Each Raw Material Powder:

Observation of a two-dimensional shape and measurement of an area of each raw material powder were carried out using an optical microscope or an electronic microscope. Then, a shape of each particle was assumed to be a true circle, and a diameter was calculated from an area value of this shape. This technique was statistically repeated, and Tables 1 to 3 show values in a particle size range (each raw material powder that is 99% by mass or more is included in this range).

Layer Thickness Measurement:

A thickness of each layer was determined by measuring a container cross section at a central (½) portion of an entire height of a sidewall of the silicon container with use of a scale.

OH Group Concentration Measurement:

This measurement was carried out by infrared absorption spectrophotometry. Conversion into OH group concentration is based on the following literature.

Dodd, D. M. and Fraser, D. B. (1966) Optical determination of OH in fused silica. Journal of Applied Physics, vol. 37, P. 3911.

Analysis of Impurity Metal Element Concentration in Inner Layer:

Analysis was carried out by plasma atomic emission spectrometry (ICP-AES) or plasma mass spectrometry (ICP-MS) when the impurity metal element concentration is relatively low (glass has high purity), or it was carried out by atomic absorption spectrophotometry (AAS) when the impurity metal element concentration is relatively high (glass has low purity). As a result, the following evaluations were provided in accordance with total concentration of 13 elements, i.e., alkali metal elements Li, Na, and K and transition metal elements Ti, V, Cr, Fe, Co, Ni, Cu, Zn, Mo, and W.

| Less than 300 ppb by mass | good |
| 300 to 3000 ppb by mass | slightly poor |
| 300 ppb by mass or more | poor |

Evaluation of Single-crystal Silicon Continuous Pulling (Multi-Pulling)

Metal polysilicon having purity of 99.99999% by mass was put into each manufactured silica container, a temperature was increased to provide a silicon melt, then pulling single-crystal silicon was repeated for three times (multi-pulling), and a success rate of single-crystal growth was evaluated. As pulling conditions, an argon (Ar) gas 100% atmosphere was provided in the pulling apparatus, a pulling rate was 0.5 mm/minute, the number of revolutions was 10 rpm, a single-crystal silicon dimension was set to a diameter of 300 mm and a length of 600 mm, and an operating time of one batch was set to approximately 100 hours. Success ratios of repetition of the single-crystal growth for three times were classified as follows.

| Succeeded three times | good |
| Succeeded twice | slightly poor |
| Once or less | poor |

Evaluation of Voids and Pinholes:

In the single-crystal silicon continuous pulling, 200 silicon wafers, each of which has a diameter of 300 mm and a thickness of 200 μm and was subjected to double-side polishing, were fabricated from an arbitrary region of the first single crystal silicon after the multi-pulling of each single crystal silicon. Then, the number of voids and pinholes present on both sides of each silicon wafer were measured, a numerical treatment was statistically carried out, and the number of defect-free silicon wafers in 200 silicon wafers were obtained. As a result, the following evaluations were provided in accordance with the numbers of silicon wafers from which both voids and pinholes were not detected. However, a diameter of each detectable void or pinhole was 50 μm or more.

| The number of defect-free silicon wafers: | |
|---|---|
| 200 | good |
| The number of defect-free silicon wafers: | |
| 199 to 198 | slightly poor |
| The number of defect-free silicon wafers: | |
| 197 or less | poor |

The manufacturing conditions for the respective silica containers manufactured in Examples 1 to 4 and Comparative Examples 1 and 2, measured physical properties, and evaluation results are collectively shown in the following Tables 1 to 4. Table 4 shows impurity analysis results of the inner layers in Examples 1 and 3 and Comparative Example 2.

TABLE 1

| Example number | | Example 1 | Example 2 |
|---|---|---|---|
| First raw material powder | | Natural quartz powder with particle size of 100 to 300 μm | Natural quartz powder with particle size of 100 to 300 μm |
| Second raw material power | | None | None |
| Temporary compact molding method | | Rotational molding method in graphite mold | Rotational molding method in graphite mold |
| Temporary compact melting method | | Reduced-pressure arc discharge melting method | Reduced-pressure arc discharge melting method |
| Temporary compact melting atmospheric gas | | $N_2$ 97% by volume, $H_2$ 3% by volume | $N_2$ 97% by volume, $H_2$ 3% by volume |
| Additional layer melting atmospheric gas | | — | — |
| Atmospheric gas in cooling | | $N_2$ 80% by volume, $O_2$ 20% by volume | $N_2$ 80% by volume, $O_2$ 20% by volume |
| Physical properties of outer layer | Color tone | White opaque | White opaque |
| | Outer diameter, Height, Thickness (mm) | Outer diameter 800 x Height 360 x Thickness 13 | Outer diameter 800 x Height 360 x Thickness 13 |
| | OH group (ppm by mass) | 50 | 50 |
| | Al (ppm by mass) | 50 | 50 |
| Physical properties of inner layer | Color tone | Colorless and transparent | Colorless and transparent |
| | Thickness (mm) | 3 | 3 |
| | OH group (ppm by mass) | 20 | 20 |
| | Al (ppm by mass) | 50 | 50 |
| | Grooves on inner surface | FIG. 4(c) (netlike) V-shaped grooves | FIG. 4(b) (radial excluding central part) V-shaped grooves |
| Evaluations | Single-crystal pulling | Slightly poor | Slightly poor |
| | Voids and pinholes | Slightly poor | Good |
| | Impurity level of inner layer | Slightly poor | Slightly poor |

TABLE 2

| Example number | | Example 3 | Example 4 |
|---|---|---|---|
| First raw material powder | | Natural quartz powder with particle size of 100 to 300 μm | Natural quartz powder with particle size of 100 to 300 μm |
| Second raw material powder | | Synthetic cristobalite powder with particle size of 100 to 300 μm | Synthetic cristobalite powder with particle size of 100 to 300 μm |
| Temporary compact molding method | | Rotational molding method in graphite mold | Rotational molding method in graphite mold |
| Temporary compact melting method | | Reduced-pressure arc discharge melting method | Reduced-pressure arc discharge melting method |
| Temporary compact melting atmospheric gas | | He 90% by volume, $H_2$ 10% by volume | He 90% by volume, $H_2$ 10% by volume |
| Additional layer melting atmospheric gas | | He 90% by volume, $H_2$ 10% by volume | He 90% by volume, $H_2$ 10% by volume |
| Atmospheric gas in cooling | | $N_2$ 80% by volume, $O_2$ 20% by volume | $N_2$ 80% by volume, $O_2$ 20% by volume |
| Physical properties of outer layer | Color tone | White opaque | White opaque |
| | Outer diameter, Height, Thickness (mm) | Outer diameter 800 x Height 360 x Thickness 11 | Outer diameter 800 x Height 360 x Thickness 11 |
| | OH group (ppm by mass) | 20 | 20 |
| | Al (ppm by mass) | 60 | 60 |
| Physical properties of inner layer | Color tone | Colorless and transparent | Colorless and transparent |
| | Thickness (mm) | 5 | 5 |
| | OH group (ppm by mass) | 10 | 10 |
| | Al (ppm by mass) | 3 | 3 |
| | Grooves on inner surface | FIG. 4(e) (radial vortex shape) U-shaped grooves | FIG. 4(f) (radial vortex shape excluding central part) U-shaped grooves |
| Evaluations | Single-crystal pulling | Good | Good |
| | Voids and pinholes | Good | Good |
| | Impurity level of inner layer | Good | Good |

TABLE 3

| Example number | | Comparative Example 1 | Comparative Example 2 |
|---|---|---|---|
| First raw material powder | | Natural quartz powder with particle size of 100 to 300 μm | Natural quartz powder with particle size of 100 to 300 μm |
| Second raw material powder | | None | Synthetic cristobalite powder with particle size of 100 to 300 μm |
| Temporary compact molding method | | Rotational molding method in graphite mold | Rotational molding method in graphite mold |
| Temporary compact melting method | | Reduced-pressure arc discharge melting method | Normal-pressure arc discharge melting method |
| Temporary compact melting atmospheric gas | | Air | Air |
| Additional layer melting atmospheric gas | | — | Air |
| Atmospheric gas in cooling | | Air | Air |
| Physical properties of outer layer | Color tone | White opaque | White opaque |
| | Outer diameter, Height, Thickness (mm) | Outer diameter 800 x Height 360 x Thickness 13 | Outer diameter 800 x Height 360 x Thickness 11 |
| | OH group (ppm by mass) | 40 | 90 |
| | Al (ppm by mass) | <3 | <3 |
| Physical properties of inner layer | Color tone | Colorless and transparent | Colorless and transparent |
| | Thickness (mm) | 3 | 5 |
| | OH group (ppm by mass) | 50 | 110 |
| | Al (ppm by mass) | <3 | <3 |
| | Grooves on inner surface | None | None |
| Evaluations | Single-crystal pulling | Slightly poor | Good |
| | Voids and pinholes | Poor | Poor |
| | Impurity level of inner layer | Slightly poor | Good |

TABLE 4

(unit: ppb by mass)

| Example number | Example 1 | Example 3 | Comparative Example 2 |
|---|---|---|---|
| Li | 500 | 10 | 20 |
| Na | 750 | 60 | 70 |
| K | 120 | 20 | 30 |
| Ti | 500 | 10 | 15 |
| V | 50 | 5 | 5 |
| Cr | 100 | 10 | 15 |
| Fe | 120 | 30 | 20 |
| Co | 30 | 5 | 5 |
| Ni | 80 | 15 | 15 |
| Cu | 120 | 10 | 10 |
| Zn | 30 | 5 | 5 |
| Mo | 30 | 10 | 10 |
| W | 20 | 5 | 5 |

As can be understood from Tables 1 to 4, in each of Examples 1 to 4, the single-crystal silicon having less voids or pinholes was manufactured. In particular, it was revealed that, as the groove pattern, the spiral radial pattern (FIGS. 4(e) and (f)) in Examples 3 and 4 was effective.

It is to be noted that the present invention is not restricted to the foregoing embodiment. The foregoing embodiment is just an illustrative example, and any example that has substantially the same configuration and exercises the same functions and effects as the technical concept disclosed in claims according to the present invention is included in the technical scope of the present invention.

The invention claimed is:
1. A single-crystal silicon pulling silica container comprising an outer layer made of opaque silica glass containing gaseous bubbles and an inner layer made of transparent silica glass that does not substantially contain the gaseous bubbles, the container also comprising: a bottom portion, a curved portion, and a straight body portion, wherein continuous grooves are formed on a surface of the inner layer from at least part of the bottom portion to at least part of the straight body portion through the curved portion.

2. The single-crystal silicon pulling silica container according to claim 1,
wherein the grooves are formed to reach a center of the bottom portion.

3. The single-crystal silicon pulling silica container according to claim 1,
wherein the grooves are not formed in a central part of the bottom portion.

4. The single-crystal silicon pulling silica container according to claim 1,
wherein the grooves are formed in a netlike pattern or a radial pattern on the bottom portion and the curved portion, the radial pattern being centered on a center of the bottom portion.

5. The single-crystal silicon pulling silica container according to claim 2,
wherein the grooves are formed in a netlike pattern or a radial pattern on the bottom portion and the curved portion, the radial pattern being centered on a center of the bottom portion.

6. The single-crystal silicon pulling silica container according to claim 3,
wherein the grooves are formed in a netlike pattern or a radial pattern on the bottom portion and the curved portion, the radial pattern being centered on a center of the bottom portion.

7. The single-crystal silicon pulling silica container according to claim 1,
wherein the grooves are formed to reach an upper edge of the straight body portion.

8. The single-crystal silicon pulling silica container according to claim 1,
wherein a cross-sectional shape of each of the grooves is any one of a V-like shape, a U-like shape, and a rectangular shape.

9. The single-crystal silicon pulling silica container according to claim 1,
wherein the grooves are formed at intervals that fall within the range of 1 to 30 mm at least in the straight body portion.

10. The single-crystal silicon pulling silica container according to claim 1,
wherein the outer layer has OH group concentration of 10 to 300 ppm by mass and Al concentration of 10 to 300 ppm by mass.

11. The single-crystal silicon pulling silica container according to claim 1,
wherein the inner layer has OH group concentration of 1 to 100 ppm by mass and Al concentration of 50 ppm by mass or less.

12. A method for manufacturing a single-crystal silicon pulling silica container, comprising: performing heating and melting of a silica powder to fabricate a silica container which comprises an outer layer made of an opaque silica glass containing gaseous bubbles and an inner layer made of transparent silica glass which does not substantially contain gaseous bubbles, the silica container also comprising a bottom portion, a curved portion, and a straight body portion; and then forming continuous grooves on a surface of the inner layer from at least part of the bottom portion to at least part of the straight body portion through the curved portion.

13. The method for manufacturing a single-crystal silicon pulling silica container according to claim 12,
wherein the fabrication of the silica container that is effected by heating and melting the silica power is carried out based on:
a step of fabricating a silica powder having a particle size of 10 to 1000 μm as a first raw material powder;
a step of putting the first raw material powder into a mold having rotational symmetry, and temporarily molding it into a predetermined shape associated with an inner wall of the mold while rotating the mold, thereby obtaining a temporary compact; and
a discharge heating melting step of placing carbon electrodes in the temporary compact, and heating and melting the temporary compact by the discharge heating melting method so that at least an outer side portion of the temporary compact is made of the opaque silica glass and an inner side portion of the same is made of the transparent silica glass.

14. The method for manufacturing a single-crystal silicon pulling silica container according to claim 13, comprising:
a step of fabricating a silica powder having a particle size of 10 to 1000 μm and higher purity than the first raw material powder as a second raw material powder; and
a step of heating and melting the second raw material powder by a discharge heating melting method while spreading it from an upper side of the silica container and further forming a layer made of transparent silica glass on a surface portion of an inner layer of the silica container at least after the discharge heating melting step and before formation of the grooves.

15. The method for manufacturing a single-crystal silicon pulling silica container according to claim 13,
wherein, at the discharge heating melting step, the temporary compact is depressurized from an outer side of the mold to degas the temporary compact.

16. The method for manufacturing a single-crystal silicon pulling silica container according to claim 14,
wherein, at the discharge heating melting step, the temporary compact is depressurized from an outer side of the mold to degas the temporary compact.

17. The method for manufacturing a single-crystal silicon pulling silica container according to claim 13,
wherein, at the discharge heating melting step, an inert mixed gas containing 1 to 10% by volume of a hydrogen gas is supplied from an inner side of the temporary compact.

18. The method for manufacturing a single-crystal silicon pulling silica container according to claim 14,
wherein, at the discharge heating melting step, an inert mixed gas containing 1 to 10% by volume of a hydrogen gas is supplied from an inner side of the temporary compact.

19. The method for manufacturing a single-crystal silicon pulling silica container according to claim 15,
wherein, at the discharge heating melting step, an inert mixed gas containing 1 to 10% by volume of a hydrogen gas is supplied from an inner side of the temporary compact.

20. The method for manufacturing a single-crystal silicon pulling silica container according to claim 12,
wherein a distal end cross-sectional shape of a rotary grinding plate of a groove formation grinder used in formation of the grooves has any one of a V-like shape, a U-like shape, and a rectangular shape.

* * * * *